(12) United States Patent
Nguyen et al.

(10) Patent No.: US 6,696,829 B1
(45) Date of Patent: Feb. 24, 2004

(54) SELF-RESETTING PHASE LOCKED LOOP

(75) Inventors: Nhat M. Nguyen, San Jose, CA (US); Kun-Yung K. Chang, Los Altos, CA (US)

(73) Assignee: Rambus Inc., Los Altos, CA (US)

( * ) Notice: Subject to any disclaimer, the term of this patent is extended or adjusted under 35 U.S.C. 154(b) by 70 days.

(21) Appl. No.: 09/993,929

(22) Filed: Nov. 16, 2001

(51) Int. Cl.⁷ .......................... G01R 23/12; G01R 29/00
(52) U.S. Cl. ................. 324/76.53; 324/76.52; 324/76.79
(58) Field of Search .......................... 324/76.53, 76.52, 324/76.79, 233

(56) References Cited

U.S. PATENT DOCUMENTS

| | | | |
|---|---|---|---|
| 5,577,086 A | * 11/1996 | Fujimoto et al. | 375/376 |
| 5,745,011 A | 4/1998 | Scott | 331/44 |
| 5,933,058 A | * 8/1999 | Pinto et al. | 331/17 |
| 6,005,444 A | * 12/1999 | Carpelan | 331/16 |
| 6,014,042 A | 1/2000 | Nguyen | 327/3 |

OTHER PUBLICATIONS

German Gutierrez and Dan Desimone, "Integrated PLL Clock Generator for 275 MHz Graphic Displays," IEEE Custom Integrated Circuits Conference, 1990, pp. 15.1.1–15.1.4.

"CY9266 HOTLink Evaluation Board User's Guide," Cypress Semiconductor Corporation, Jun. 1995, pp. 273–274.

"Interfacing with the SST," Cypress Applications Handbook, Cypress Semiconductor Corporation, Jan. 1996, pp. 6–26 to 6–29.

* cited by examiner

Primary Examiner—N. Le
Assistant Examiner—John Teresinski
(74) Attorney, Agent, or Firm—Vierra Magen Marcus Harmon & DeNiro LLP (57) ABSTRACT

An integrated circuit device having a self-resetting phase-locked loop (PLL) circuit. The PLL circuit generates an output clock signal having a first frequency in a first operating mode and a second frequency in a second operating mode, the second frequency being determined, at least in part, by a reference clock signal. A control circuit within the integrated circuit resets the PLL circuit by selecting the first operating mode for a predetermined time interval, then selecting the second operating mode.

40 Claims, 5 Drawing Sheets

SELF-RESETTING PHASE LOCKED LOOP

FIELD OF THE INVENTION

The present invention relates generally to circuits for generating event timing signals, and more particularly to phase locked loop circuits.

BACKGROUND

Figure 1:
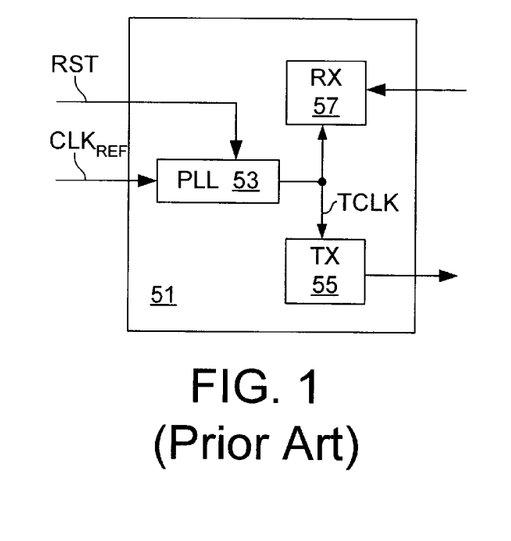
FIG. 1 illustrates a prior-art transceiver device.

Phase locked-loop (PLL) circuits are used in numerous applications to generate clock signals, strobe signals and other timing signals. For example, FIG. 1 illustrates a prior-art transceiver device 51 that includes a phase-locked loop (PLL) circuit 53, transmit circuit 55 and receive circuit 57. The PLL circuit 53 generates a transmit clock signal, TCLK, for timing the transmission of data within the transmit circuit 55 and for recovering clock and data (i.e., clock data recovery (CDR)) within the receive circuit 57. Due to closed-loop operation of the PLL circuit 53, the transmit clock signal has a frequency and phase that tracks the frequency and phase of a reference clock signal, $CLK_{REF}$, and is said to be phase-locked to the reference clock signal.

Figure 2:
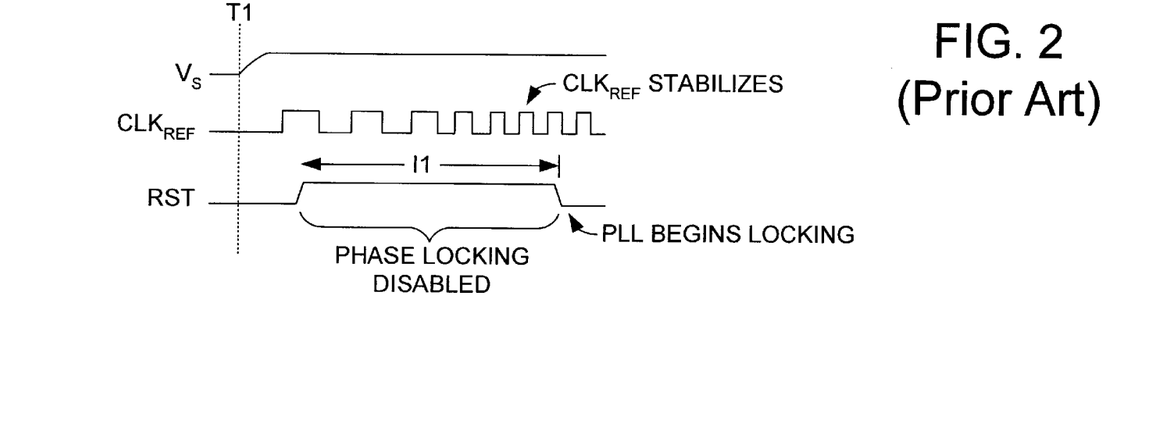
FIG. 2 illustrates a typical PLL reset sequence.

Because the PLL circuit 53 (like most PLL circuits) is able to achieve phase lock only over a limited range of reference clock frequencies, a reset signal, RST, is asserted at system power up to disable the closed-loop operation of the PLL circuit 53 until after the reference clock signal has reached a steady-state oscillation frequency. FIG. 2 illustrates a typical PLL reset sequence. At time T1, power is applied, ramping the system supply voltage, $V_S$, and enabling oscillation of the reference clock signal (e.g., by powering a crystal oscillator or other clock generator). In the example of FIG. 2, the reference clock frequency is slow at first, then gradually increases to a stabilized, steady-state oscillating frequency. A circuit for generating the reset signal (i.e., the reset signal generator) is typically tuned to the time required for the reference clock frequency to stabilize and is designed to deassert the reset signal (e.g., to a high logic state) for a corresponding reset delay interval, I1, to disable the phase locking operation of the PLL. After the reset delay interval has elapsed, the reset signal generator drives the reset signal low to reset (i.e., enable) the phase locking operation of the PLL circuit 53.

Typically, the reset signal generator is implemented in an integrated circuit (IC or chip), or discrete-component circuit that is distinct from the IC containing the PLL circuit 53. One reason for this is that the reset delay interval is determined by the stabilization time of the reference clock generator (often implemented by a crystal oscillator or other off-chip timing circuit) and therefore tends to vary from system to system according to the choice of reference clock generator. Unfortunately, off-chip generation of the reset signal means that an additional IC pin (or other interface structure) and signal path must be provided to couple the reset signal generator to the PLL circuit 53. Aside from the added fabrication expense and design cost, in some instances it may be impractical to provide an extra pin or signal path for PLL reset purposes; particularly where the IC containing the PLL circuit 53 is required to fit into a previously designed socket, pad array, etc. (i.e., a so-called socket-stealing application) that does not provide for a PLL reset signal. Accordingly, it would be desirable to provide a PLL circuit having a self-resetting capability.

SUMMARY

A phase-locked loop (PLL) circuit having a self-resetting function is described in various embodiments. In a first embodiment, a lock control circuit is provided within the PLL circuit to detect when a supply voltage has reached a predetermined level and, in response, to reset the PLL circuit by pulsing a lock enable signal for a predetermined time. In another embodiment, a lock control circuit pulses the lock enable signal for a predetermined time upon detecting that a reference clock signal has reached a threshold oscillation frequency. In either embodiment, the predetermined time may be determined by hardwired circuit components or may be programmable by a host device.

These and other features and advantages of the present invention are described in the detailed description below.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following description, for purposes of explanation, specific nomenclature is set forth to provide a thorough understanding of the present invention. However, it will be apparent to one skilled in the art that these specific details may not be required to practice the present invention. Additionally, the interconnection between circuit elements or blocks may be shown as buses or as single signal lines. Each of the buses may alternatively be single signal lines, and each of the single signal lines may alternatively be buses. Herein, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when a signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Active low signals may be changed to active high signals and vice-versa as is generally known in the art.

Overview of a Self-Resetting PLL Circuit

Figures 3, 4:
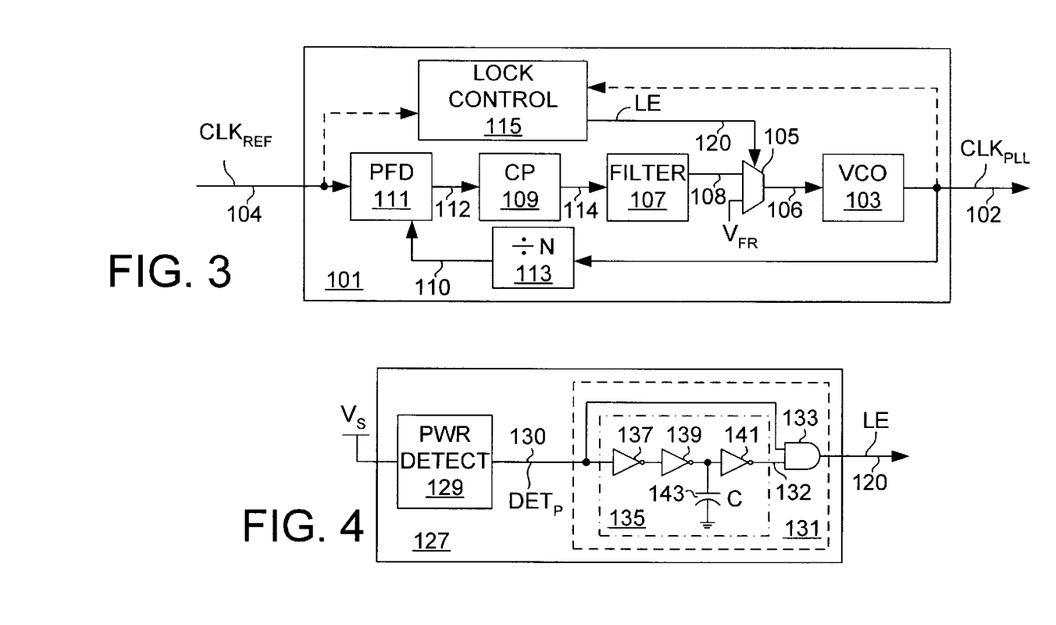
FIG. 3 illustrates an embodiment of a self-resetting PLL circuit.
FIG. 4 illustrates a power-detecting embodiment of a lock control circuit that may be used within the PLL circuit of FIG. 3.

FIG. 3 illustrates an embodiment of a self-resetting PLL circuit 101. The PLL circuit 101 includes a voltage-controlled oscillator (VCO) 103, multiplexer 105, filter circuit 107, charge pump 109, phase-frequency detector 111, divider circuit 113 and lock control circuit 115. The VCO 103 generates an output clock signal (CLK$_{PLL}$) 102 having a frequency, f$_{PLL}$, that ranges between a minimum frequency and a maximum frequency (thereby defining a tuning range of the PLL circuit 101) according to a tuning signal 106 received from the multiplexer 105. The lock control circuit 115 outputs a lock enable signal 120 to the multiplexer 105 to select either a loop-generated tuning signal 108 or a fixed-level tuning signal, V$_{FR}$, to control the oscillating frequency of the VCO 103 (and therefore the frequency of the output clock signal 102). When the loop-generated tuning signal 108 is selected to control the VCO 103, the PLL circuit 101 is said to be in a phase-locking mode, and the oscillation period of the output clock signal 102 is incrementally adjusted in a phase-locking operation to track the frequency of a reference clock signal 104 (CLK$_{REF}$). By contrast, when the fixed-level tuning signal, V$_{FR}$, is selected to control the VCO 103, the oscillation period of the output clock signal is independent from the reference clock frequency and remains relatively constant (i.e., except for drift due to changes in temperature, voltage and device aging). That is, when the fixed-level tuning signal is selected, the PLL circuit 101 outputs a free-running clock signal having a deterministic clock period (as opposed to a phase-locked clock signal having a feedback-adjusted clock period) and is said to be in a free-running mode.

The loop-generated tuning signal 108 is generated by closed-loop operation of the divider circuit 113, phase frequency detector 111, charge pump 109 and filter circuit 107. The divider circuit 113 divides the output clock frequency by a desired ratio, N, between the output clock frequency, f$_{PLL}$, and the reference clock frequency, f$_{RC}$, thereby generating a feedback clock signal 110 having nominally the same frequency as the reference clock signal 104. The phase frequency detector 111 compares the feedback clock signal 110 and the reference clock signal 104 and outputs a difference signal 112 that indicates whether f$_{PLL}$ is greater or less than N*f$_{RC}$(the symbol '*' is used herein to indicate multiplication). The charge pump 109 integrates the difference signal 112 to produce a time-averaged difference signal 114, and the filter circuit 113 filters transient changes from the time-averaged difference signal 114 to produce the loop-generated tuning signal 108. Overall, a negative feedback effect is produced such that the loop-generated tuning signal 108 is incrementally adjusted to reduce the output clock frequency, f$_{PLL}$, if f$_{PLL}$ is greater than N*f$_{RC}$, and to increase f$_{PLL}$ if f$_{PLL}$ is less than N*f$_{RC}$. At some point, f$_{PLL}$ begins to dither within a frequency band centered around N*f$_{RC}$, and the output clock signal 102 is said to be phase-locked to the reference clock signal 104.

Still referring to FIG. 3, the lock control circuit 115 is provided to implement the self-resetting function of the PLL circuit 101. In one embodiment, referred to herein as a power-detecting embodiment, the lock control circuit 115 resets the PLL circuit 101 in response to a power-on event by pulsing the lock enable signal 120 for a predetermined time. In another embodiment, referred to herein as a clock-detecting embodiment, the lock control circuit resets the PLL circuit 101 by pulsing the lock enable signal 120 in response to a clock-on event. Although the lock control circuit 115 is depicted in the embodiment of FIG. 3 as being included within the PLL circuit, the lock control circuit may be located elsewhere in the integrated circuit that contains the PLL circuit in alternative embodiments.

Power-Detecting Lock Control Circuit

Figure 5:
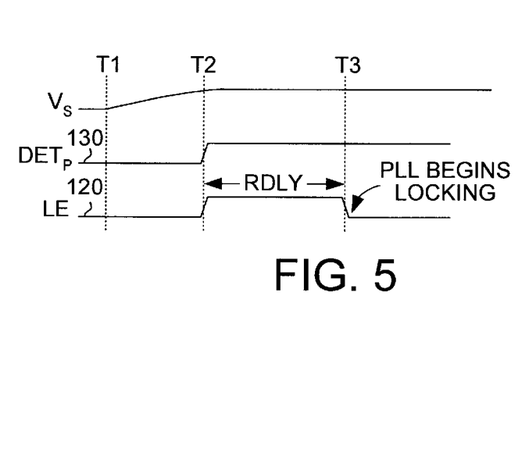
FIG. 5 is a timing diagram of the lock control circuit of FIG. 4.

FIGS. 4 and 5 illustrate the structure and operation of an exemplary power-detecting embodiment of a lock control circuit 127 that may be used within the PLL circuit 101 of FIG. 3. The lock control circuit 127 includes a power detecting circuit 129 to detect when a supply voltage, V$_S$, reaches a predetermined voltage level and to assert a power detect signal 130 (DET$_P$) in response. The lock control circuit 127 further includes a pulse generating circuit 131 coupled to receive the power detect signal 130 from the power detect circuit 129 and to generate a pulsed lock enable signal 120. The pulse generating circuit 131 includes a delay circuit 135 to generate a delayed, inverted version 132 of the power detect signal 130, and a logic AND gate 133 to logically AND the power detect signal 130 with the signal 132 output by the delay circuit 135 to produce the lock enable signal 120.

Referring to FIG. 5, after a power-on event at time T1 and just before the power detect signal 130 goes high at time T2, the delay circuit 135 has settled to a state in which the output of inverter 139 is low (matching the low state of the power detect signal), capacitive element 143 is discharged, and inverter 141 outputs a high signal 132 to the logic AND gate 133. Accordingly, when the power detect signal 130 goes high at time T2, the logic AND gate 133 responds by transitioning the lock enable signal 120 to a logic high state (i.e., a deasserted state), thereby starting a lock enable pulse. The lock enable signal 120 remains high until, at time T3, capacitive element 143 has been charged to a sufficiently high level (i.e., due to the buffering operation of inverters 137 and 139) to cause inverter circuit 141 to drive signal 132 low. When signal 132 goes low, the logic AND gate 133 asserts the lock enable signal (i.e., to a logic low state) to conclude the lock enable pulse and to enable the phase locking operation of the PLL circuit.

Figure 6:
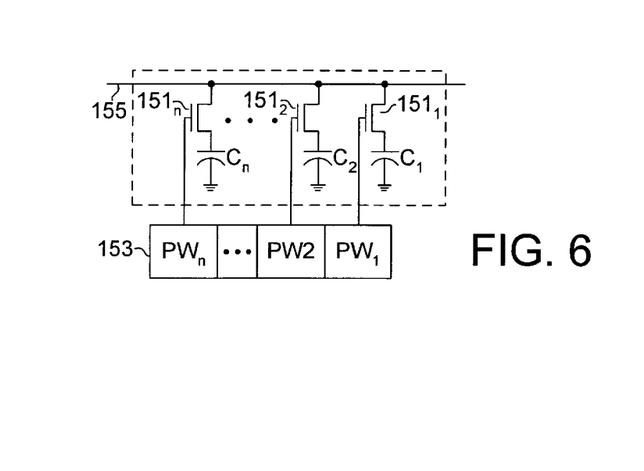
FIG. 6 illustrates an embodiment of capacitive element that may be used to provide a programmable delay within the pulse generating circuit of FIG. 4.

Still referring to FIGS. 4 and 5, the time interval between T2 and T3 (i.e., the width of the lock enable pulse, PW) constitutes a reset delay interval (RDLY) that is controlled by the RC time constant of the inverter 139 output resistance and the capacitance of the capacitive element 143. Thus, the reset delay interval may be increased or decreased by increasing or decreasing the capacitance of the capacitive element 143. FIG. 6 illustrates an embodiment of capacitive element 143 that may be used to provide a programmable delay within the pulse generating circuit 131 of FIG. 4, thereby enabling production-time or run-time selection of the reset delay interval and enabling a self-resetting PLL circuit according to the present invention to be used in systems with varying reference clock stabilization times. The capacitive element 143 includes a plurality of capacitive components (e.g., metal plate capacitors, P-N junction capacitors, MOS capacitors, etc.) $C_1$–$C_n$ that are coupled to delay line 155 (i.e., the signal line coupled to the input of inverter 141 of FIG. 4) via respective transistor switches $151_1$–$151_n$. In the embodiment of FIG. 6, each of the switches 151 is controlled by a respective bit of a pulse width value, PW[n:1]. For example, if bit PW1 of the pulse width value is a logic '1,' then transistor $151_1$ is switched on to couple capacitive element $C_1$ to the delay line 155. Conversely, if PW1 is a logic '0,' then transistor $151_1$ is switched off (i.e., switched to a substantially non-conducting state) to decouple capacitive element $C_1$ from the delay line 155. In one embodiment, each of the capacitive elements $C_1$–$C_n$ has the same capacitive value (i.e., all the capacitors are equally weighted) such that the selectable range of capacitance values ranges from zero (or nearly zero) to $n*C_1$, in steps of $C_1$. Accordingly, the width of the lock enable pulse generated by the lock control circuit 127 of FIG. 4 ranges from zero to $n*K$, where $K=R_{OUT}*C_1$ and where $R_{OUT}$ is the output resistance of the circuit used to charge the capacitive elements $C_1$–$C_n$ which are switchably coupled to the delay line 155 (i.e., the output resistance of inverter 139 in FIG. 4). In an alternative embodiment, each of the capacitive elements $C_1$–$C_n$ is binary weighted such that $C_2=2*C_1$, $C_3=2*C_2$, ..., and $C_n=2*C_{n-1}$. Accordingly, the selectable capacitance ranges from 0 to $C_1*(2^n-1)$ in steps of $C_1$, and the selectable width of the lock enable pulse ranges from 0 to $(2^n-1)*K$. Other weightings may be used in alternative embodiments, and one or more capacitive elements may be directly coupled to the delay line 155 (i.e., without transistor switches being interposed) to achieve a minimum capacitance other than zero. The pulse width value itself may be stored in a configuration storage circuit 153 that is programmed during initialization of the device containing the PLL circuit or at another time. For example, a peer or master device may issue a configuration command (including or indicating a pulse width value) to the device containing the PLL circuit to store the pulse width value in the configuration storage circuit 153 (e.g., a configuration register) after the device is powered on, thereby programming the pulse width of the lock enable signal 120. Alternatively, a non-volatile storage or one-time programmable circuit (e.g., electrically programmable read-only memory (EPROM), erasable EPROM (EEPROM), flash EPROM, fuse-based circuit, etc.) may be used to implement the configuration storage circuit. 153 and may be programmed, for example, at device production time according to a customer-specified lock-enable pulse width (e.g., using test equipment or other device to interface with the device containing the PLL circuit to program the pulse width value therein) or by a customer at system-integration time.

Clock-Detecting Lock Control Circuit

In some clocking applications it may be desirable to temporarily disable oscillation of the reference clock signal, then re-start oscillation of the reference clock signal at a later time. For example, in high-speed signaling applications, it may be desirable to switch off the reference clock generator during periods of non-communication to save power, then switch the reference clock generator back on when communication is necessary. In such applications, it may be necessary to reset a PLL circuit not only after initial power on, but after each re-starting of the reference clock signal. Clock-detecting embodiments of the present invention may be used to implement self-resetting PLL circuits for use in such applications.

Figure 7:
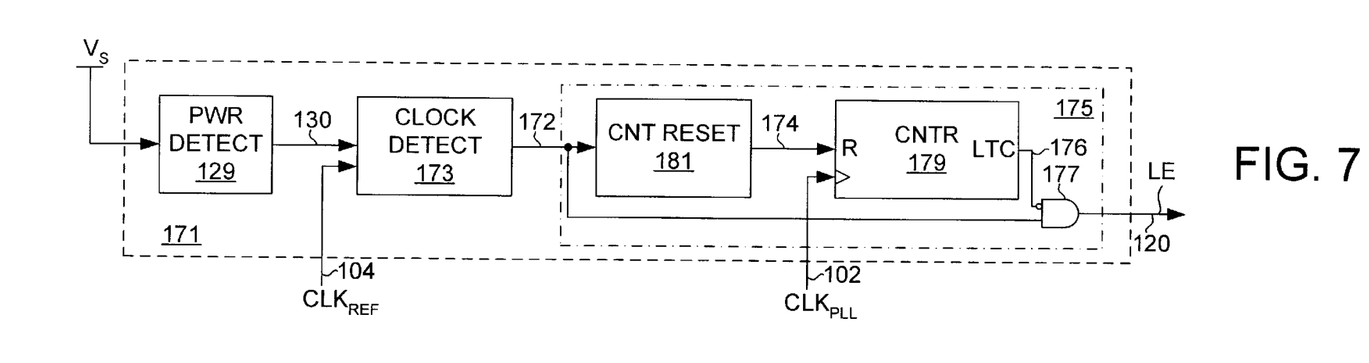
FIG. 7 illustrates a clock-detecting embodiment of a lock control circuit that may be used within the PLL circuit of FIG. 3.
Figure 8:
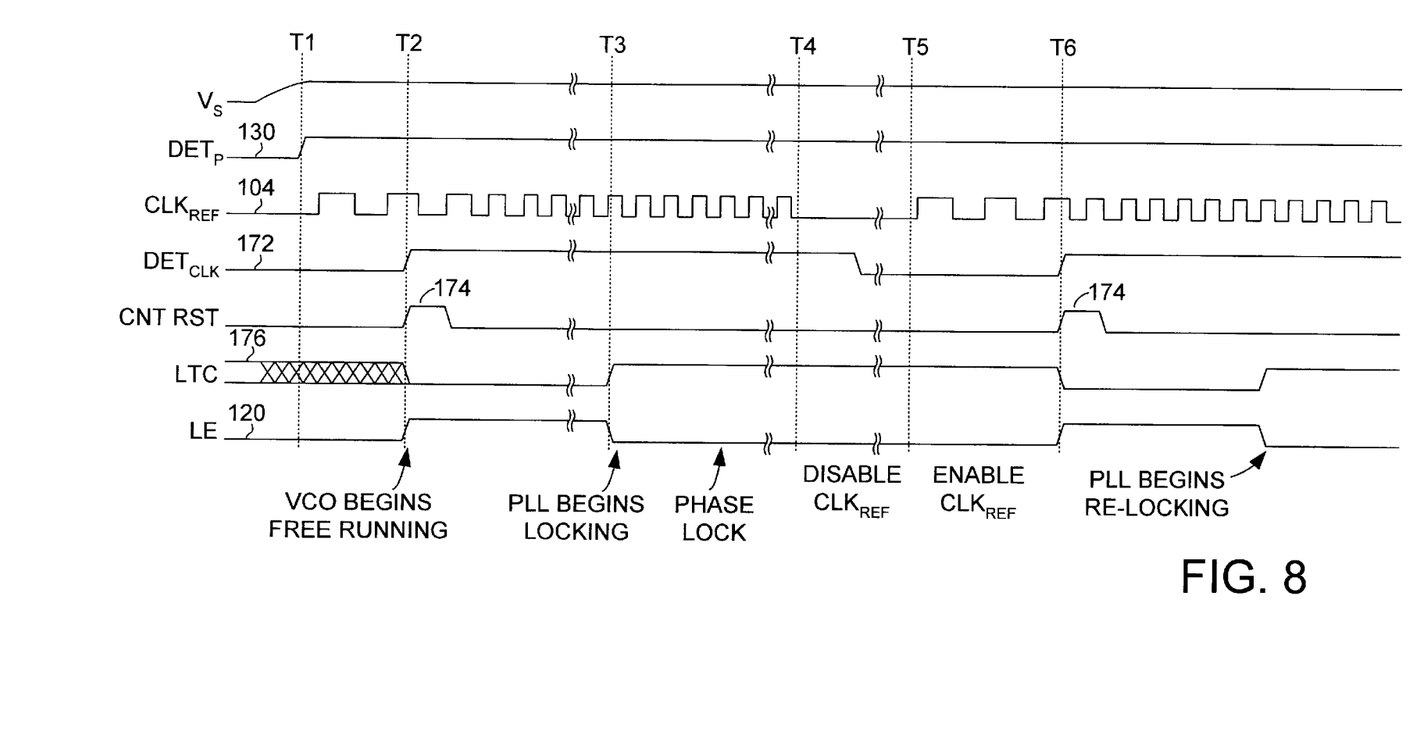
FIG. 8 is a timing diagram of the lock control circuit of FIG. 7.

FIGS. 7 and 8 illustrate the structure and operation of an exemplary clock-detecting embodiment of a lock control circuit 171 that may be used within the PLL circuit 101 of FIG. 3. The lock control circuit 171 includes a power detect circuit 129, clock detect circuit 173 and pulse generating circuit 175. The power detect circuit 129 operates as described in reference to FIGS. 4 and 5 to assert a power detect signal 130 upon detecting that a supply voltage, $V_S$, has reached a predetermined voltage level. The clock detect circuit 173 receives the power detect signal 130 and the reference clock signal 104 and outputs a clock detect signal 172 upon detecting that the reference clock signal 104 has reached a threshold oscillation frequency and that the power detect signal 130 is asserted. The pulse generating circuit 175 includes a count reset circuit 181, counter circuit 179 and logic AND gate 177 to generate a pulsed lock enable signal 120 in response to assertion of the clock detect signal 172.

Referring to FIG. 8, the power detect circuit 171 asserts the power detect signal 130 ($DET_P$) at time T1 (after the supply voltage, $V_S$, has reached the predetermined level), and the reference clock signal 104 ($CLK_{REF}$) begins oscillating shortly thereafter. At time T2, the clock detect circuit 173 detects that the reference clock frequency has reached the threshold frequency and asserts the clock detect signal 172 ($DET_{CLK}$). The count reset circuit 181 within the pulse generating circuit 175 responds to assertion of the clock detect signal 172 (and assertion of the power detect signal) by generating a count reset pulse 174. The count reset circuit may be implemented, for example, by the pulse generating circuit 131 of FIG. 4, or any other pulse-generating circuit. The count reset pulse 174 is applied to a reset input (designated 'R' in FIG. 7) of the N-bit counter 179 to reset a count value maintained by the counter 179 to a start count value, and also to reset a latched terminal count signal 176 (LTC) to a low state. An inverting input of the logic AND gate 177 is coupled to receive the latched terminal count signal 176 from the counter circuit 179 and a non-inverting input of the logic AND gate 177 is coupled to receive the clock detect signal 172 from the clock detect circuit 173. Accordingly, prior to time T2, the output of the logic AND gate 177 (which drives the lock enable signal 120) is low due to the low clock detect signal 172 (the state of the latched terminal count signal 176 is indeterminate prior to time T2, though the latched terminal count signal 176 may alternatively be reset to a known state at system power up). At time T2, when the clock detect signal 172 goes high and the latched terminal count signal 176 is reset to a low state, the output of the logic AND gate 177 transitions to a high state to produce a rising edge of the lock enable signal 120 (i.e., leading edge of the lock enable pulse).

The output clock signal 102 ($CLK_{PLL}$) is provided to a strobe input of the counter circuit 179. Consequently, when the lock enable signal 120 goes high, the free-running mode of the PLL circuit is selected (i.e., VCO begins free running as indicated in FIG. 8) and the resulting free-running output clock signal is used to incrementally adjust the count value within the counter circuit 179 from the start count value to a terminal count value. When the terminal count value is reached (i.e., at time T3), the latched terminal count signal 176 is asserted (e.g., to a logic high state) causing logic AND gate 177 to drive the lock enable signal 120 low, thereby generating the falling edge of the lock enable pulse. When the lock enable signal 120 goes low, the phase locking mode of operation within the PLL circuit is selected.

The interval from T2 to T3 (i.e., the width of the lock enable pulse and therefore the duration of the reset delay interval) is determined by the free running period of the output clock signal and the start and terminal count values as follows:

lock enable pulse width=(Terminal Count−Start Count)/$f_{PLL}$

Accordingly, the terminal count value and/or start count value may be selected to provide a reset delay interval of sufficient duration for the reference clock signal 104 to stabilize. Thus, as shown in FIG. 8, the lock enable signal 120 does not go low (and therefore the phase locking mode of the PLL circuit is not enabled) until after the reference clock signal 104 has stabilized, and the PLL circuit achieves phase lock shortly after the lock enable signal 120 goes low. Note that, in alternative embodiments, the reference clock signal 104 may be used to increment the count value within counter circuit 179 instead of the output clock signal 102. One advantage of using the output clock signal 102, however, is that, in the free-running mode, the output clock signal 102 is deterministic (i.e., has a relatively static period) whereas the reference clock signal 104, depending upon the manner in which it is generated, may be a less deterministic timing source, and therefore less certain to provide a sufficiently long reset delay interval.

As mentioned above, in certain applications it may be desirable to temporarily disable (i.e., turn off) the reference clock signal 104, for example, to conserve power. In the clock detecting embodiment of FIG. 7, such an event is detected by the clock detect circuit 173 which responds by deasserting the clock detect signal 172. This operation is shown in FIG. 8 by the loss of the reference clock signal 104 at time T4, and the deassertion of the clock detect signal 172 a short time later. When the reference clock signal 104 is later re-started (i.e., at time T5), the clock detect circuit 173 again determines when the reference clock signal 104 reaches the threshold oscillating frequency and asserts the clock detect signal 172 in response (i.e., at time T6). The count reset circuit 181 responds to the assertion of the clock detect signal 172 at time T6 by generating the count reset pulse 174, thereby resetting the count value and latched terminal count signal 176 within counter circuit 179. When the latched terminal count signal 176 is reset (e.g., to a low state in this example), the lock enable signal 120 goes high, starting a new lock enable pulse and again selecting the free-running mode of the PLL circuit. Accordingly, the counter circuit 179 counts transitions of the free running output clock signal 102 until the terminal count is reached, at which time the latched terminal count 176 goes high to re-enable the phase locking mode of the PLL. Thus, the PLL circuit performs a self-reset in response to the re-started reference clock signal 104 and begins re-locking in response to the low-going lock enable signal 120.

Figures 9, 10, 11, 12, 13, 14:
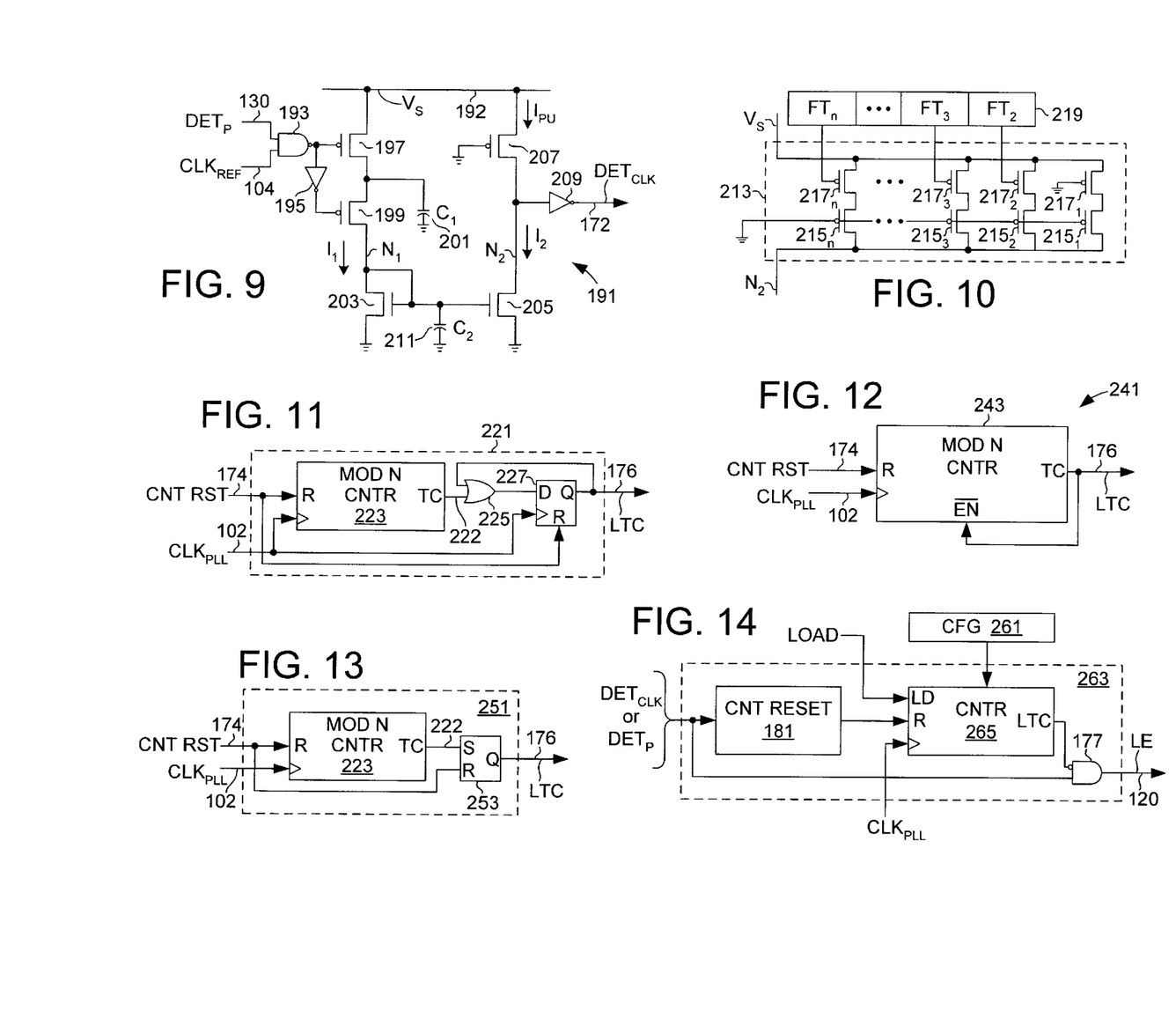
FIG. 9 illustrates an exemplary embodiment of the clock detect circuit of FIG. 7.
FIG. 10 illustrates a configurable load circuit that may be used within the clock detect circuit of FIG. 9.
FIG. 11 illustrates an embodiment of a counter circuit for generating a latched terminal count signal.
FIG. 12 illustrates an alternative embodiment of a counter circuit for generating a latched terminal count signal.
FIG. 13 illustrates another embodiment of a counter circuit for generating a latched terminal count signal.
FIG. 14 illustrates an embodiment of a programmable pulse generating circuit that may be used within the lock control circuit of FIG. 7 and the lock control circuit of FIG. 4.

FIG. 9 illustrates an exemplary embodiment of the clock detect circuit 173 of FIG. 7. The clock detect circuit 173 includes a logic NAND gate 193 having respective inputs to receive the power detect signal 130 and reference clock signal 104, and an output coupled to a gate terminal of transistor 197 and, through inverter 195, to a gate terminal of transistor 199. Transistors 197 and 199, and diode-configured transistor 203 are coupled in series between a voltage supply line 192 and a reference voltage 194 (ground in this example) to form a first current conducting leg of the clock detect circuit 191. Transistors 207 and 205 are also coupled in series between the voltage supply line 192 and ground to form a second current conducting leg of the clock detect circuit 191. Also, diode-configured transistor 203 and transistor 205 are coupled in a current mirror configuration (i.e., coupled gate-to-gate, with high pass filtering provided by capacitive element 211 ($C_2$)) such that the current through the first and second legs of the clock detect circuit 191 are proportional. That is current $I_2=K*I_1$, where K is a constant of proportionality achieved by the current mirror (K may be any number). A capacitive element 201 ($C_1$) is coupled between ground and the interconnection between transistors 197 and 199, and an inverter 209 is coupled to the interconnection of transistors 207 and 209 (i.e., node $N_2$) and generates the clock detect signal 172 by inverting the signal level at node $N_2$.

Whenever the reference clock signal 104 is not oscillating (e.g., at system power up or when the reference clock is otherwise turned off) or the power detect signal 130 is not asserted, one or the other of transistors 197 and 199 is switched off, thereby causing current $I_1$, and therefore current $I_2$, to be zero (negligible). Transistor 207 effectively operates as a load resistance, $R_L$, so that the steady-state voltage at node $N_2$ ($V_{N2}$) is determined by the level of current $I_2$ as follows:

$$V_{N2}=V_S-(R_L*I_2) \qquad (1)$$

Accordingly, when current $I_2$ is zero, node $N_2$ is pulled up to $V_S$, causing inverter 209 to drive the clock detect signal 172 low. Thus, whenever the reference clock signal 104 is turned off or the power detect signal 130 is deasserted, the clock detect signal 172 is driven low by the clock detect circuit 191.

Due to the operation of inverter 195, transistor 197 is switched on whenever transistor 199 is switched off, and vice-versa. Consequently, when the reference clock signal 104 begins oscillating (after the power detect signal is asserted), capacitive element 201 is alternately coupled to the supply voltage line 192 and to node $N_1$, and therefore is alternately charged and discharged. The current flowing into and out of the capacitive element 201 is proportional to the rate of change of voltage across the capacitor and therefore is proportional to the rate at which transistors 197 and 199 are alternated between on and off states. More specifically, current $I_2$ is determined by the oscillation frequency of the reference clock signal 104, the size of the capacitive element 201, and $V_{N1}$ (i.e., the gate voltage of transistor 203) as follows:

$$I_1=(V_S-V_{N1})*f_{RC}*C_1 \qquad (2)$$

Due to the proportionality (K) between currents $I_2$ and $I_1$, equations (1) and (2) may be combined to express the voltage at node $N_2$ in terms of the reference clock frequency as follows:

$$V_{N2}=V_S-[R_L*K*(V_S-V_{N1})*f_{RC}*C_1] \qquad (3)$$

Thus, as the reference clock frequency increases, the voltage at node $N_2$ drops until, at a threshold frequency of the reference clock signal, $f_{THRESH}$, the voltage at node $N_2$ is reduced to a sufficiently low level, $V_{DET}$, to cause inverter 209 to drive the clock detect signal 172 high. Thus, when the power detect signal 130 is asserted and the reference clock frequency reaches the threshold frequency, $f_{THRESH}$, the clock detect circuit asserts the clock detect signal 172 (to a logic high state in this example). If the reference clock signal 104 is later turned off, $I_1$ and therefore $I_2$ will return to zero, causing the voltage at node $N_2$ to be pulled up to $V_S$ and, due to inverter 209, causing the clock detect signal 172 to go low.

Equation (3) above may be rearranged to express the threshold reference clock frequency in terms of the voltage at node $N_2$ (i.e., $V_{DET}$), the proportionality, K, between currents $I_2$ and $I_1$, the load resistance $R_L$, and the size of the capacitive element 201, as follows:

$$f_{THRESH} = (V_S - V_{DET})/[K^* (V_S - V_{N1})^* R_L^* C_1] \qquad (4)$$

Thus, the threshold frequency is dependent upon the size of the capacitive element 201, the load resistance presented by transistor 207 and the proportionality constant of the current mirror implemented by transistors 203 and 205. Consequently, any or all of those elements may be selected according to system needs to achieve a desired threshold frequency. For example, capacitive element 201 may be selected to achieve a threshold frequency slightly lower than the steady state oscillation frequency of the reference clock signal 104. By this arrangement, the reference clock frequency may drift (up or down) within a specified tolerance without loss of clock detect (i.e., deassertion of the clock detect signal 172). Also, for added flexibility the capacitive element 201 may be programmable as described in reference to FIG. 6 to allow a run-time or one-time programmed threshold frequency. Similarly, transistor 207 may be sized (e.g., having a particular length and width) to achieve a desired load resistance, $R_L$, and therefore a desired threshold frequency. Also, either or both of transistors 203 or 205 may be sized to achieve a desired proportionality, K, between currents $I_2$ and $I_1$, and therefore a desired threshold frequency.

FIG. 10 illustrates a configurable load circuit 213 that may be used in place of transistor 207 of FIG. 9 to enable run-time programmability of the load resistance, $R_L$, and therefore run-time programmability of the threshold frequency, $f_{THRESH}$. Circuit 213 includes a plurality of load transistors $215_1 - 215_n$ that are switchably coupled in parallel with one another between the supply voltage (i.e., node 192 of FIG. 9) and node $N_2$ of FIG. 9. Gate terminals of the load transistors $215_1 - 215_n$ are coupled to one another and to a bias voltage (ground in this case). Transistors $217_1 - 217_n$ are coupled between transistors $215_1 - 215_n$, respectively, and the supply voltage node to enable selected ones of the load transistors $215_1 - 215_n$ to affect the total load resistance of the configurable load circuit 213. In the embodiment of FIG. 10, the gate terminal of transistor $217_1$ is coupled to ground so that transistor $215_1$ is permanently rather than switchably coupled to the voltage supply node (thereby preventing an open circuit condition). Transistors $217_2 - 217_n$, by contrast, are responsive to respective bits of a threshold frequency value, FT[n:2] to selectively couple one or more of load transistors $215_1 - 215_n$ in parallel with load transistor $215_1$. In one embodiment, the load resistance each of the load transistors 215 is $R_T$ such that the total load resistance of the configurable load circuit 213 ranges from $R_T$ (when none of the load transistors $215_2 - 215_n$ are enabled to affect the total load resistance) to $R_T/n$ (when all the load transistors 215 are enabled). In an alternative embodiment, each of the load transistors 215 is binary weighted (e.g., by having varied lengths and/or widths) such that the resistance of transistor $215_2$ is twice the resistance of transistor $215_1$ (i.e., $R_{T2} = 2^*R_{T1}$), and similarly, $R_{T3} = 2^*R_{T2}, \ldots, R_{Tn} = 2^*R_{Tn-1}$. In another alternative embodiment, each of the load transistors is binary weighted such that $R_{T2} = R_{T1}/2, R_{T3} = R_{T2}/2, \ldots, R_{Tn} = R_{Tn-1}/2$. Numerous other weighting arrangements may be used in alternative embodiments.

Still referring to FIG. 10, the threshold frequency value itself may be stored in a configuration storage circuit 219 that is programmed during initialization of the device containing the PLL circuit or at another time. For example, a peer or master device may issue a configuration command (including or indicating the threshold frequency value) to the device containing the PLL circuit to store the threshold frequency value in the configuration storage circuit 219 (e.g., a configuration register) after the device is powered on, thereby programming the threshold frequency of the clock detect circuit 191 of FIG. 9. Alternatively, a non-volatile storage or one-time programmable circuit (e.g., electrically programmable read-only memory (EPROM), erasable EPROM (EEPROM), flash EPROM, fuse-based circuit, etc.) may be used to implement the configuration storage circuit 219 and may be programmed, for example, at device production time according to a customer-specified threshold frequency or by a customer at system-integration time.

Referring again to FIG. 9, it should be noted that one or both of transistors 203 and 205 may also be replaced by the circuit of FIG. 10 (e.g., in one embodiment, using NMOS transistors in place of the PMOS transistors 215 and 217 depicted in FIG. 10), to allow programmability of the proportionality constant, K, between currents $I_2$ and $I_1$. Also, any combination of a programmable capacitance (e.g., of element 201), load resistance (element 207) or proportionality constant may be used in alternative embodiments.

Reflecting on the lock control circuit of FIG. 7 and the clock detect circuit of FIG. 9, it should be noted that the power detect circuit 129 (and therefore logic NAND gate 193 of FIG. 9) may be omitted in an alternative embodiment. In such an embodiment, the lock enable signal is pulsed whenever the reference clock frequency ramps from a frequency below the threshold frequency to a frequency above the threshold frequency (the detection of which is dependent, at least in part, on the presence of system power).

FIG. 11 illustrates an embodiment of a counter circuit 221 for generating a latched terminal count signal 176. The counter circuit 221 includes a modulo N counter 223 that counts up from a start count of zero to a terminal count of $2^N - 1$, then rolls over to zero and begins counting up again. The counter 223 is responsive to a count reset pulse 174 (received at a reset input, R) to reset the count value to zero, and includes a terminal count output (designated TC in FIG. 11) to assert a terminal count signal 222 (e.g., to a logic high state) during the count cycle in which the count value is equal to the terminal count. A logic OR gate 225 and flip-flop 227 are provided to generate the latched terminal count signal 176. More specifically, when counter 223 outputs a high terminal count signal 222 (indicating that $2^N - 1$ transitions of the output clock signal 102 have been counted), the output of the logic OR gate 225 goes high. At a subsequent transition of the output clock signal 102, the high output of the logic OR gate 225 is captured within the flip-flop 227 and output to provide a high latched terminal count signal 176. The output of the flip-flop 227 is fed back to an input of the logic OR gate 225 to maintain a logic high value at the input of the flip-flop 227 and thereby latching the logic high output of the flip-flop. 227 (i.e., latching the terminal count signal 222 to produce latched terminal count signal 176). The count reset signal 174 is input to a reset input of the flip-flop 227 so that, when the count reset signal 174 is asserted, the output of the flip-flop 227 (and therefore the latched terminal count signal 176) is reset to a logic low state.

FIG. 12 illustrates an alternative embodiment of a counter circuit 241 for generating a latched terminal count signal 176. The counter circuit 241 includes a modulo N counter 243 designed to count up from zero to a terminal count of $2^N - 1$, assert a terminal count signal during the final count cycle (i.e., when the count value is $2^N-1$), then roll over to zero. The counter circuit 243 is also responsive to an active low signal at a count enable input $\overline{EN}$) to selectively enable counting and disable counting. As shown in FIG. 12, a terminal count output (TC) of the counter circuit is coupled to the count enable input such that, so long as the terminal count signal (which constitutes the latched terminal count signal 176) remains low, counting is enabled. When the terminal count is reached, the terminal count signal 176 goes high, disabling the counter from counting further (i.e., preventing the count value from rolling over to zero) and thereby latching the high state of the terminal count signal 176.

FIG. 13 illustrates yet another embodiment of a counter circuit 251 for generating a latched terminal count signal 176. The counter of FIG. 13 includes a modulo N counter circuit 223 that operates as described above in reference to FIG. 11, but includes a set/reset flip-flop 253 to latch the terminal count output of the counter circuit 223 instead of the logic OR gate 225 and clock-strobed flip-flop 227 of the FIG. 11 embodiment. The terminal count output (TC) of the counter circuit 223 is coupled to a set input (S) of the set/reset flip-flop 253 so that, when the counter circuit 223 asserts the terminal count signal 222, the high state of the terminal count signal 222 is latched at the set/reset flip-flop output (Q) to provide the latched terminal count signal 176. The count reset signal 174 is coupled to a reset input (R) of the set/reset flip-flop 253 and, when asserted, resets the latched terminal count signal 176 to a logic low state.

In each of the exemplary counter circuits described in reference to FIGS. 10–12, the counter circuits may count down instead of up, and may count from any start count to any terminal count value. Also, the pulse generator of FIG. 7, including any of the counter circuits of FIGS. 10–12, may be used in place of the pulse generator of FIG. 4 in alternative power-detecting embodiments of the lock control circuit.

Programmable Lock Enable Pulse Width

FIG. 14 illustrates an embodiment of a programmable pulse generating circuit 263 that may be used within the lock control circuit 171 of FIG. 7 and the lock control circuit 127 of FIG. 4. The pulse generating circuit 263 includes a count reset circuit 181, counter circuit 265 and logic AND gate 177 that operate generally as described above in reference to FIG. 7 to generate a pulsed lock enable signal 120 in response to a clock detect signal (or in response to a power detect signal if used in the lock control circuit of FIG. 4). The counter circuit 265, however, includes a preload port coupled to receive a count value from a configuration storage circuit 261. When a load signal is asserted, the count value is loaded (i.e., programmed) into the counter circuit 265 to establish the total number of count cycles between the start count and terminal count of the counter. In one embodiment, the programmed count value is a start count, and the counter circuit 265 is a down-counter that counts down from the start count to zero. In an alterative embodiment, the programmed count value is a terminal count and the counter circuit 265 is an up-counter that counts up from zero to the terminal count. In yet another embodiment, the count value is a count increment value that sets the amount by which the count within counter circuit 265 is incremented in response to a signal transition the strobe input of the counter circuit 265. In general, any value that may be used to control the number of count cycles between the start count and terminal count (and therefore to control the width of the lock enable pulse) may be used without departing from the spirit and scope of the present invention.

The configuration storage circuit 261 may be located within the self-resetting PLL circuit that includes the pulse generating circuit 263, elsewhere on an integrated circuit device that contains the self-resetting PLL circuit, or on a separate integrated circuit device. The programmed count value itself may be stored in the configuration storage circuit 261 during initialization of the system containing the PLL circuit. For example, a peer or master device may issue a configuration command (including or indicating the programmed count value) to an integrated circuit device containing the PLL circuit (i.e., the PLL device) to instruct the PLL device to store the programmed count value in the configuration storage circuit 261 after system power on, thereby programming the pulse width of the lock enable signal. Alternatively, a non-volatile storage or one-time programmable circuit (e.g., electrically programmable read-only memory (EPROM), erasable EPROM (EEPROM), flash EPROM, fuse-based circuit, etc.) may be provided within the PLL device to implement the configuration storage circuit. Such a non-volatile storage or one-time programmable circuit may be programmed with a count value, for example, at production time according to a customer-specified lock-enable pulse width (e.g., using test equipment or other device to interface with the PLL device to program the pulse width value therein) or by a customer at system-integration time.

System Application of Self-Resetting PLL Circuit

Figure 15:
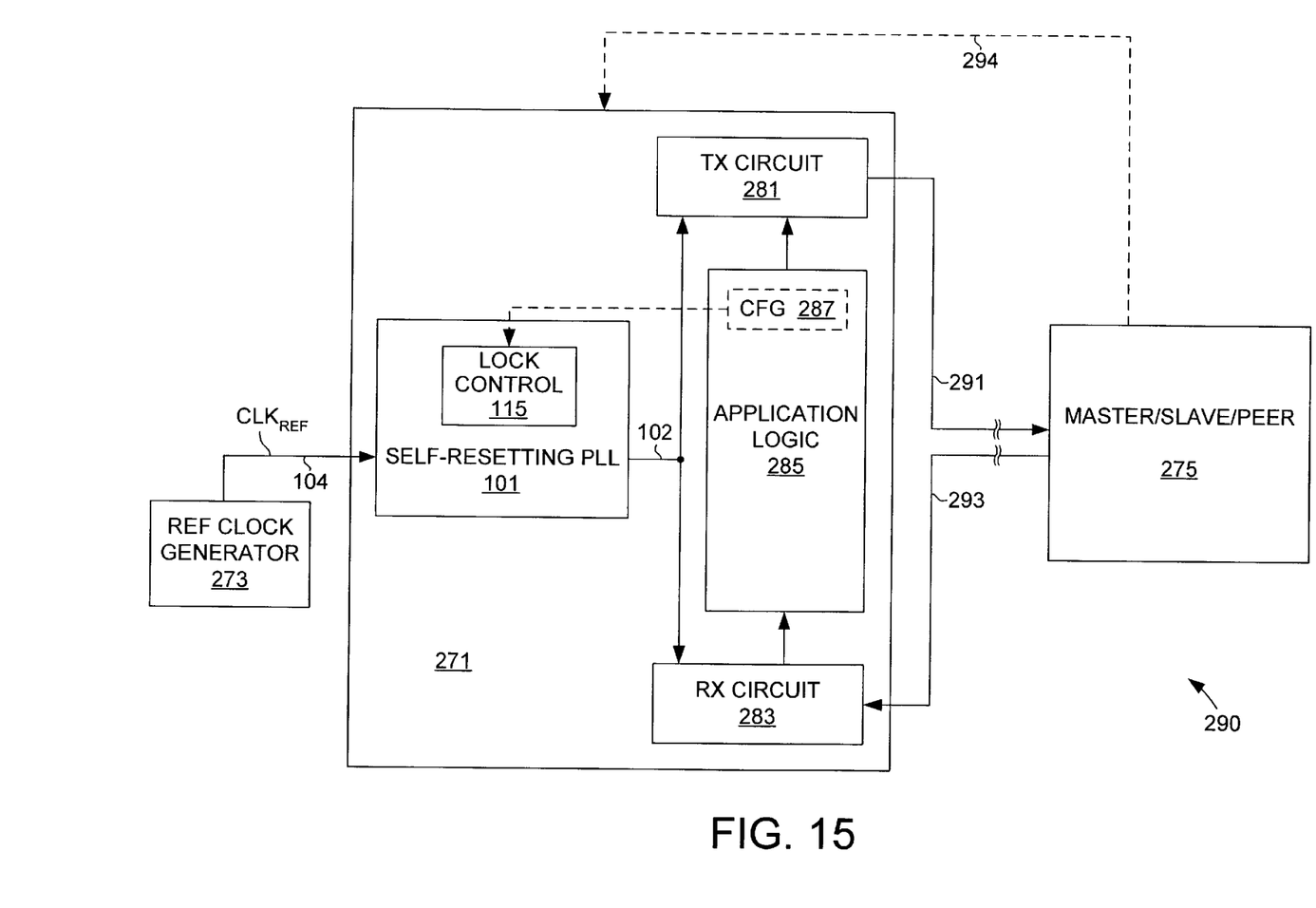
FIG. 15 illustrates a system in which a self-resetting PLL according to embodiments described in reference to FIGS. 3–13 may be used.

FIG. 15 illustrates a system 290 in which a self-resetting PLL according to embodiments described above in reference to FIGS. 3–13 may be used. The system 290 may be used, for example, within a computing device (e.g., mobile, desktop or larger computer), networking equipment (e.g., switch, router, etc.), consumer electronics device (e.g., telephone, camera personal digital assistant (PDA), etc.), or any other type of device in which a PLL circuit may be used.

The system includes a pair of integrated circuits (ICs) 271 and 275 coupled to one another via a transmit signal path 291 and a receive signal path 293. In the embodiment, shown, the signal paths are unidirectional high speed serial links for conducting serialized transmissions from one IC to the other. In alternative embodiments, either or both of the links may be bi-directional (i.e., with appropriate circuitry provided to select which of the ICs is enabled to transmit on the link at a given time), and multiples of such signal paths may be provided to enable transmission of parallel groups of bits (e.g., each group of bits forming a data or control word (e.g., command, address, etc.) or portion of a data or control packet). The ICs 271 and 275 may be peers (e.g., each IC is capable of independently initiating a signal transmission to the other), or master and slave. Also, the relative status of the ICs may change from time-to-time such that one IC is a master at a first time, then a slave at another time, and/or a peer at another time.

IC 271 is shown in simplified block diagram form and includes a transmit circuit 281, receive circuit 283, self-resetting PLL circuit 101, and application logic 285. As shown, the self-resetting PLL circuit 101 is coupled to receive a reference clock signal 104 from an off-chip reference clock generator 273, and outputs a phase-locked clock signal 102 to the transmit circuit 281 and the receive circuit 283. The self-resetting PLL circuit 101 includes a lock control circuit 115 that operates as described above in reference to FIGS. 3–13, to generate a pulsed lock enable signal to reset the PLL circuit 101. That is, in a power detecting embodiment, the lock control circuit 115 resets the PLL circuit 101 in response to a power detect event, and in a clock detecting embodiment, the lock control circuit 115 resets the PLL circuit 101 in response to a clock detect event. In the embodiment of FIG. 15, a configuration storage circuit 287 (e.g., run-time programmable register, non-volatile storage, fused storage, etc.) within the application logic 285 is used to store one or more values for configuring the PLL circuit 101. For example, the configuration storage circuit 287 may be used to store a frequency threshold value (i.e., to control the frequency threshold at which a clock detect event is signaled), or a value to control the width of the lock enable pulse generated by the lock control circuit 115, such as a capacitance select value (i.e., as described in reference to FIG. 6) or a count value to be loaded into a counter circuit within the lock control 115 circuit (i.e., as described above in reference to FIG. 14). In one embodiment, the IC 275 is designed and/or programmed to issue a configure command (or request or instruction) to the IC 271 to store one or more PLL configuration value(s) (e.g., value indicative of lock enable pulse width and/or value indicative of threshold frequency) in the configuration storage circuit 287. The PLL configuration values may be provided in an operation code of the configure command or as associated operand data. The application logic 285 responds to the configure command by storing the indicated PLL configuration values within the configuration storage circuit 287, and issuing appropriate commands to the PLL circuit 101 to apply the configuration values (e.g., asserting the load signal depicted in FIG. 14 to load a count value into a counter circuit within the lock control circuit 115 of the PLL circuit 101). Note that the configuration storage circuit may be located elsewhere in the IC 271 in alternative embodiments.

Because the transmission and reception of signals via signal paths 291 and 293 is timed, in part, by the clock signal 102 generated by the self-resetting PLL circuit 101, full speed transmission of signals over the signal paths 291 and 293 may not be possible until the PLL circuit is properly configured. Thus, in one embodiment, the PLL configuration command and PLL configuration values may be transmitted via an out-of-band signaling path (shown by dotted line 294 in FIG. 15), or the configuration command and PLL configuration values may be transmitted at a reduced frequency over the signal path 293.

Although two ICs are shown in FIG. 15, the circuits within each of the ICs may alternatively be implemented in a single IC (e.g., in a system-on-chip or similar application), with signal paths 291 and 293 being routed via metal layers or other signal conducting structures fabricated within the IC. Also, if distinct ICs are used as shown in FIG. 15, the ICs may be packaged in separate IC packages (e.g., plastic or ceramic encapsulation, bare die package, etc.) or in a single IC package (e.g., multi-chip module, paper thin package (PTP), etc.).

Although the invention has been described with reference to specific exemplary embodiments thereof, it will be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An integrated circuit device comprising:
a phase-locked loop (PLL) circuit to generate an output clock signal having a first frequency in a first operating mode and a second frequency in a second operating mode, the second frequency being determined, at least in part, by a reference clock signal; and
a control circuit to output a select signal to the PLL circuit to select either the first operating mode or the second operating mode, wherein the PLL circuit includes,
an oscillation circuit; and
a select circuit, coupled to the oscillation circuit and the control circuit, the select circuit being responsive to the select signal to select either a fixed-level control signal or a reference-clock-dependent control signal to be output as a selected control signal to the oscillation circuit, the oscillation circuit being responsive to the selected control signal to oscillate at either the first frequency or the second frequency to generate the output clock signal.

2. The integrated circuit device of claim 1 wherein the PLL circuit further comprises circuitry to detect a phase difference between the output clock signal and the reference clock signal and to adjust a level of the reference-clock-dependent control signal according to the phase difference.

3. The integrated circuit device of claim 1 wherein the PLL circuit further comprises circuitry to detect a frequency difference between the output clock signal and the reference clock signal and to adjust a level of the reference-clock-dependent control signal according to the frequency difference.

4. The integrated circuit device of claim 1 wherein, in the second operating mode, the output clock signal is phase locked to the reference clock signal.

5. The integrated circuit device of claim 1 wherein, in the second operating mode, the period of the output clock signal is adjusted from time to time by the PLL circuit to achieve a predetermined temporal relationship between the second frequency of the output clock signal and the frequency of the reference clock signal.

6. The integrated circuit device of claim 5 wherein the period of the output clock signal is adjusted from time to time by the PLL circuit such that the second frequency of the output clock signal is substantially equal to the frequency of the reference clock signal multiplied by a predetermined number.

7. The integrated circuit device of claim 1 wherein, in the first operating mode, a fixed-level control signal is selected by the select signal to set the frequency of the output clock signal to the first frequency.

8. The integrated circuit device of claim 1 wherein the control circuit is adapted to detect when a supply voltage has reached a predetermined level and, in response, to output the select signal in a first state for a predetermined time and then transition the select signal to a second state, the first and second states of the select signal selecting the first and second operating modes of the PLL circuit, respectively.

9. The integrated circuit device of claim 8 wherein the control circuit comprises:
a power detect circuit to detect when the supply voltage has reached the predetermined level and to output a power detect signal in response; and
a pulse generating circuit coupled to receive the power detect signal from the power detect circuit, and being responsive to the power detect signal to output, as the select signal, a pulse having a width that corresponds to the predetermined time.

10. The integrated circuit device of claim 8 wherein the control circuit comprises a circuit to count transitions of a timing signal and to transition the select signal to the second state after a predetermined number of transitions of the timing signal have been counted.

11. The integrated circuit device of claim 10 wherein the timing signal is the output clock signal.

12. The integrated circuit device of claim 10 wherein the timing signal is the reference clock signal.

13. The integrated circuit device of claim 10 further comprising a storage circuit to store a count value indicative of a number of transitions of the timing signal, the count circuit being coupled to receive the count value from the storage circuit and being adapted to transition the select signal to the second state in response to counting the number of transitions of the timing signal indicated by the count value.

14. The integrated circuit device of claim 13 further comprising circuitry to receive the count value from an external device and to store the count value in the storage circuit.

15. The integrated circuit device of claim 8 wherein the predetermined time corresponds to a time required for the reference clock signal to reach a steady-state oscillating frequency.

16. The integrated circuit device of claim 8 wherein the control circuit comprises a pulse generating circuit to generate a pulse having a programmable duration, the pulse generating circuit being adapted to transition the select signal to the second state upon conclusion of the pulse.

17. The integrated circuit device of claim 1 wherein the control circuit comprises a clock detect circuit to receive the reference clock signal and to assert a clock detect signal when the frequency of the reference clock reaches a threshold frequency and, thereafter, to deassert the clock detect signal if the frequency of the reference clock falls below the threshold frequency.

18. The integrated circuit device of claim 17 wherein the clock detect circuit is adapted to re-assert the clock detect signal if, after the frequency of the reference clock signal falls below the threshold frequency, the frequency of the reference clock signal is later increased to a frequency greater than the threshold frequency.

19. The integrated circuit device of claim 17 wherein the control circuit is adapted to output the select signal in a first state for a predetermined time in response to assertion of the clock detect signal and then to transition the select signal to a second state, the first and second states of the select signal selecting the first and second operating modes of the PLL circuit, respectively.

20. The integrated circuit device of claim 19 wherein the control circuit comprises a circuit to count transitions of a timing signal and to transition the select signal to the second state after a predetermined number of transitions of the timing signal have been counted.

21. The integrated circuit device of claim 20 wherein the circuit to count transitions of the timing signal comprises a counter circuit to increment a count value from an initial value to a terminal value in response to transitions of the timing signal, and to output a terminal count signal when the count value reaches the terminal value.

22. The integrated circuit device of claim 21 wherein the counter circuit is coupled to receive the clock detect signal from the clock detect circuit and comprises circuitry to reset the count value to the initial value in response to assertion of the clock detect signal.

23. The integrated circuit device of claim 19 wherein the circuit to count transitions of the timing signal is adapted to begin counting transitions of the timing signal in response to assertion of the clock detect signal.

24. An integrated circuit device comprising:
a phase-locked loop (PLL) circuit capable to generate an output clock signal having a first frequency in a first operating mode and a second frequency in a second operating mode, the second frequency being determined, at least in part, by a reference clock signal; and
a control circuit capable to output a select signal to the PLL circuit to select either the first operating mode or the second operating mode,
wherein the control circuit includes a pulse generating circuit capable to generate a pulse having a programmable duration, the pulse generating circuit being adapted to transition the select signal to the second state upon conclusion of the pulse,
wherein the control circuit is adapted to detect when a supply voltage has reached a predetermined level and, in response, to output the select signal in a first state for a predetermined time and then transition the select signal to a second state, the first and second states of the select signal selecting the first and second operating modes of the PLL circuit, respectively; and
a storage circuit capable to store a pulse width value indicative of the programmable duration, the pulse generating circuit coupled to receive the pulse width value from the storage circuit and adapted to selectively enable a plurality of delay elements within the pulse generating circuit according to the pulse width value to achieve the programmable duration.

25. The integrated circuit device of claim 24 wherein the programmable duration corresponds to the sum of delay times contributed respectively by the plurality of delay elements that are enabled by the pulse width value.

26. The integrated circuit device of claim 25 wherein each of the plurality of delay elements is a capacitive delay element that is switchably coupled to a delay line.

27. The integrated circuit device of claim 25 wherein each of the plurality of delay elements, when enabled, contributes a delay time that is substantially equal to the delay time contributed by any other of the enabled delay elements.

28. The integrated circuit device of claim 25 wherein each of the plurality of delay elements, when enabled, contributes a binary weighted delay time.

29. An integrated circuit device comprising:
a phase-locked loop (PLL) circuit to generate an output clock signal having a first frequency in a first operating mode and a second frequency in a second operating mode, the second frequency being determined, at least in part, by a reference clock signal; and
a control circuit coupled to the PLL circuit to select either the first operating mode or the second operating mode according to whether the frequency of the reference clock signal exceeds a threshold frequency;
wherein the control circuit includes,
a clock detect circuit to generate a clock detect signal indicative of whether the frequency of the reference clock signal exceeds the threshold frequency; and
a timing circuit coupled to receive the clock detect signal from the clock detect circuit and adapted to output a select signal to the PLL circuit to select either the first operating mode or the second operating mode according to the clock detect signal,
wherein the PLL circuit includes, a multiplexer, coupled to an oscillator, capable to receive the select signal.

30. The integrated circuit device of claim 29 wherein the timing circuit is responsive to the clock detect signal to output the select signal in a first state for a predetermined time and then transition the select signal to a second state, the first and second states of the select signal selecting the first and second operating modes of the PLL circuit, respectively.

31. The integrated circuit device of claim 30 wherein the timing circuit comprises a circuit to count transitions of a timing signal and to transition the select signal to the second state after a predetermined number of transitions of the timing signal have been counted.

32. The integrated circuit device of claim 31 further comprising a storage circuit to store a count value indicative of a number of transitions of the timing signal, the count circuit being coupled to receive the count value from the storage circuit and being adapted to transition the select signal to the second state in response to counting the number of transitions of the timing signal indicated by the count value.

33. The integrated circuit device of claim 29 wherein the control circuit comprises a clock detect circuit to detect when the frequency of the reference clock signal exceeds the threshold frequency and, in response, to assert a clock detect signal.

34. An integrated circuit device comprising:

a phase-locked loop (PLL) circuit capable to generate an output clock signal having a first frequency in a first operating mode and a second frequency in a second operating mode, the second frequency being determined, at least in part, by a reference clock signal;

a control circuit coupled to the PLL circuit capable to select either the first operating mode or the second operating mode according to whether the frequency of the reference clock signal exceeds a threshold frequency, wherein the control circuit includes a clock detect circuit to detect when the frequency of the reference clock signal exceeds the threshold frequency and, in response, to assert a clock detect signal; and a storage circuit capable to store a control value indicative of the threshold frequency, the clock detect circuit coupled to receive the control value from the storage circuit and adapted to selectively enable a plurality of load elements to form a selected load impedance, the threshold frequency being proportional to the selected load impedance.

35. The integrated circuit device of claim 34 wherein each of the plurality of load elements is a capacitive load element switchably coupled in parallel with each of the others of the plurality of load elements, the threshold frequency being proportional to a sum of capacitance values contributed by the enabled ones of the plurality of capacitive load elements.

36. The integrated circuit device of claim 34 wherein each of the capacitive load elements has substantially the same capacitance value as each of the others of the capacitive load elements.

37. The integrated circuit device of claim 34 wherein each of the capacitive load elements has a binary weighted capacitance value.

38. The integrated circuit device of claim 34 wherein the threshold frequency is inversely proportional to the selected load impedance, and wherein the plurality of load elements are resistive load elements.

39. The integrated circuit device of claim 34 further comprising a storage circuit to store a control value indicative of the threshold frequency, the clock detect circuit being coupled to receive the control value from the storage circuit and being adapted to selectively enable a plurality of transistors according to control value to select the threshold frequency.

40. The integrated circuit device of claim 34, wherein the clock detect circuit comprises a circuit that generates a control current in proportion to the frequency of the reference clock signal, the threshold frequency corresponding to a threshold value of the control current that results in assertion of the clock detect signal.

* * * * *